United States Patent
Hundt et al.

(10) Patent No.: US 8,163,220 B2
(45) Date of Patent: Apr. 24, 2012

(54) METHOD OF PACKAGING INTEGRATED CIRCUITS

(75) Inventors: Michael J. Hundt, Double Oak, TX (US); Tiao Zhou, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 43 days.

(21) Appl. No.: 12/154,726

(22) Filed: May 27, 2008

(65) Prior Publication Data

US 2008/0290557 A1    Nov. 27, 2008

Related U.S. Application Data

(62) Division of application No. 10/961,910, filed on Oct. 8, 2004, now abandoned, which is a division of application No. 10/151,323, filed on May 20, 2002, now Pat. No. 6,817,854.

(51) Int. Cl.
*B29C 45/02* (2006.01)
*B29C 45/14* (2006.01)

(52) U.S. Cl. ............... 264/272.15; 264/272.17; 264/275

(58) Field of Classification Search ........................ None
See application file for complete search history.

(56) References Cited

U.S. PATENT DOCUMENTS

| | | |
|---|---|---|
| 4,044,984 A | 8/1977 | Shimizu et al. |
| 4,076,791 A | 2/1978 | Barter et al. |
| 4,314,960 A | 2/1982 | Hass |
| 4,442,056 A | 4/1984 | Slepcevic |
| 4,584,155 A | 4/1986 | Zanella |
| 4,612,081 A | 9/1986 | Kasper et al. |
| 4,626,185 A | 12/1986 | Monnet |
| 4,686,073 A | 8/1987 | Koller |
| 4,688,752 A | 8/1987 | Barteck et al. |
| 4,732,553 A | 3/1988 | Hofer |
| 5,059,105 A | 10/1991 | Baird |
| 5,118,271 A | 6/1992 | Baird et al. |
| 5,344,296 A | 9/1994 | Laninga |
| 5,622,873 A | 4/1997 | Kim et al. |
| 5,766,650 A | 6/1998 | Peters et al. |
| 5,798,070 A | 8/1998 | Sakai et al. |
| 5,958,466 A | 9/1999 | Ong |
| 5,997,798 A | 12/1999 | Tetreault et al. |
| 6,019,588 A | 2/2000 | Peters et al. |
| 6,667,439 B2 | 12/2003 | Salatino et al. |
| 2003/0006529 A1 | 1/2003 | Ho et al. |

FOREIGN PATENT DOCUMENTS

JP    61234536 A    10/1986

OTHER PUBLICATIONS

Gunter Mennig, "Mold-Making Handbook", 1998, Hanser/Gardner Publications, Inc., 2nd Edition, pp. 47-52 and 223-229.

*Primary Examiner* — Edmund H. Lee

(57) ABSTRACT

The bottom mold portion for a transfer molding system is covered with a deformable material. During mold clamping, the deformable material contacts the bottom surface of the packaging substrate on which the integrated circuit die is mounted. Deformation of this relatively soft covering on the bottom mold portion accommodates thickness variations in the packaging substrate, as well as non-planarity of the adhesive layer between the integrated circuit die and packaging substrate in exposed active area integrated circuits.

20 Claims, 1 Drawing Sheet

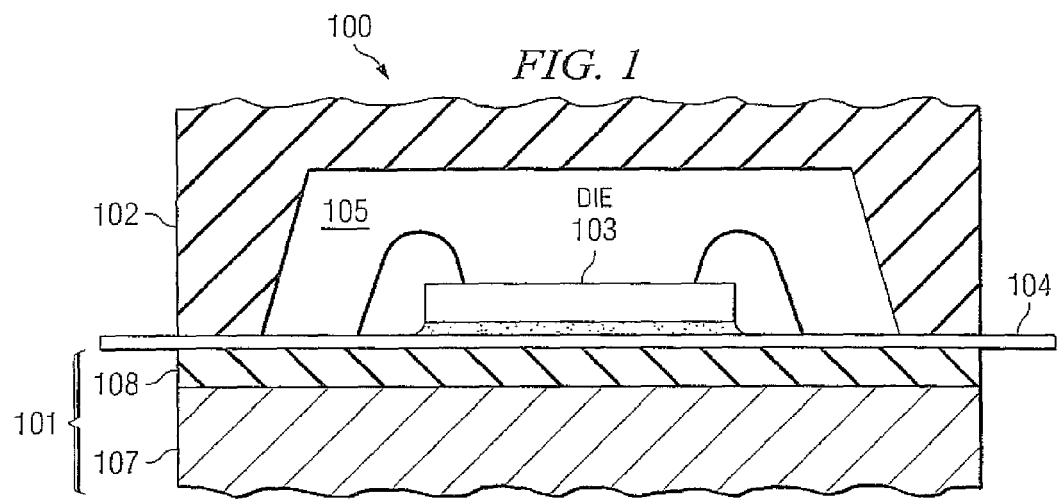
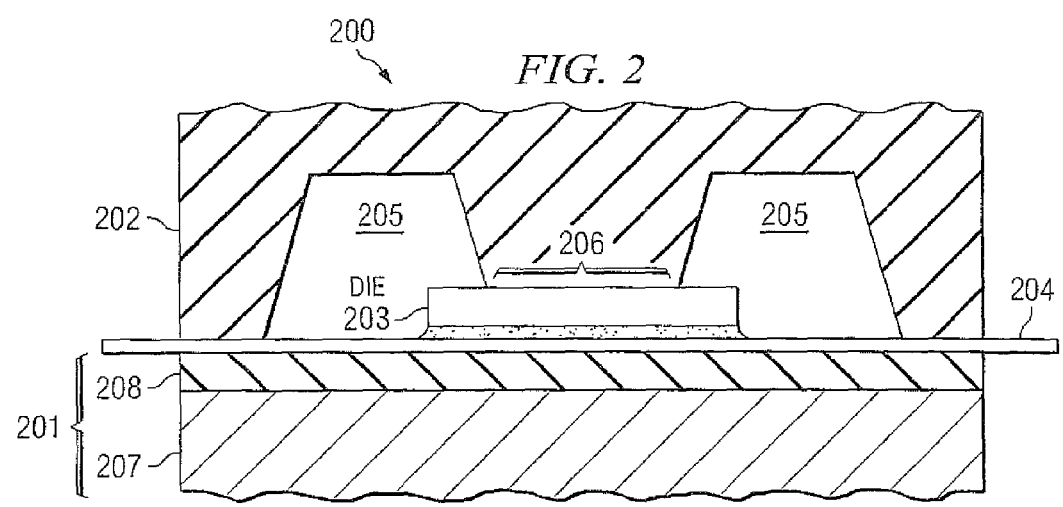
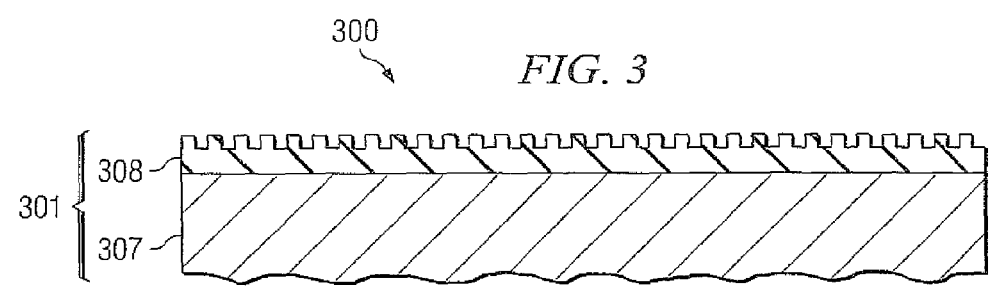

METHOD OF PACKAGING INTEGRATED CIRCUITS

This application is a divisional of prior U.S. patent application Ser. No. 10/961,910 filed on Oct. 8, 2004 now abandoned, which is a divisional of U.S. patent application Ser. No. 10/151,323 filed on May 20, 2002 now U.S. Pat. No. 6,817,854.

TECHNICAL FIELD OF THE INVENTION

The present invention is directed, in general, to transfer molding during integrated circuit packaging and, more specifically, to transfer molding tolerating localized lead frame or packaging substrate thickness variations.

BACKGROUND OF THE INVENTION

Transfer molding systems employed for integrated circuit packaging generally utilize hardened steel mold surfaces to clamp onto the lead frame or packaging substrate, forming the mold cavity.

Such transfer molding systems, however, are poorly suited where the lead frame or packaging substrate has local thickness variations. Either leakage of the encap-sulating material or damage to the packaging substrate (e.g., damage to the conductive traces thereon) may result. any wire bonds, and the packaging substrate 204 exposed to the cavity 205. However, a portion of the upper mold portion 202 in mold system 200 contacts the active area 206 of the integrated circuit die 203 to prevent injected encapsulating material from contacting that surface 206. The active area 206 is thus left exposed after packaging.

In the present invention, lower mold portion 201 comprises hardened steel 207 covered by a relatively soft, deformable material 208. Therefore non-planarity of the adhesive between the integrated circuit die 203 and the packaging substrate 204, and consequent "tilt" of the integrated circuit die 203 with respect to the packaging substrate 204 and the surface of upper mold portion 202 that contacts the active area 206, is compensated by deformation of the relatively soft material 208 (and possibly minor, localized deformation of packaging substrate 204). No gap between the active area 206 and upper mold surface contacting the active area remains into which injected encapsulating material may flow.

SUMMARY OF THE INVENTION

To address the above-discussed deficiencies of the prior art, it is a primary object of the present invention to provide, for use in transfer molding system, a bottom mold portion that is covered with a deformable material. During mold clamping, the deformable material contacts the bottom surface of the packaging substrate on which the integrated circuit die is mounted. Deformation of this relatively soft covering on the bottom mold portion accommodates thickness variations in the packaging substrate, as well as non-planarity of the adhesive layer between the integrated circuit die and packaging substrate in exposed active area integrated circuits.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 1 depicts a transfer molding system that tolerates thickness variations in the lead frame or packaging substrate according to one embodiment of the present invention;

FIG. 2 depicts a transfer molding system that tolerates non-planarity of the exposed active area integrated circuit die when mounted on the lead frame or packaging substrate according to one embodiment of the present invention;

FIG. 3 depicts a lower mold portion for a transfer molding system according to an alternative embodiment of the present invention.

DETAILED DESCRIPTION OF THE INVENTION

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a transfer molding system that tolerates thickness variations in the lead frame or packaging substrate according to one embodiment of the present invention. Mold system 100 includes a lower mold portion 101 and an upper mold portion 102 that are adapted to receive, between the two portions 101 and 102, an integrated circuit die 103 affixed to a packaging substrate 104 (e.g., a plastic sheet) by an adhesive such as epoxy. In the example shown, wire bonds electrically connect integrated circuit die 103 to conductive traces on the packaging substrate 104.

The lower mold portion 101 has an upper surface that contacts the bottom surface of packaging substrate 104, while the upper mold portion 102 defines a cavity 105 around integrated circuit die 103, the wire bonds and at least a portion of the upper surface of packaging substrate 104. The upper mold portion 102 contacts the upper surface of the packaging substrate 104 only around a periphery of the cavity 105. The lower mold portion 101 contacts the bottom surface of the packaging substrate 104 over at least an area corresponding to the contact area of upper mold portion 102 on the upper surface of the packaging substrate 104.

Once the mold portions 101 and 102 are assembled with an integrated circuit die 103 and packaging substrate 104 received therein as shown in FIG. 1, encapsulating material such as epoxy or thermosetting resin is injected into the cavity 105 via injection conduits (not shown) through the upper mold portion 102 to cavity 105. The injected encapsulating material adheres to and hardens around the integrated circuit die 103, any wire bonds, and the portion of packaging substrate 104 underlying cavity 105, forming the packaged integrated circuit.

In the present invention, the lower mold portion 101 includes hardened steel 107 covered by an elastomeric, deformable material 108 (e.g., neoprene rubber). The deformable material 108 contacts the bottom surface of packaging substrate 104 during mold clamping (closure), and compensates for non-planarity (e.g., general or localized thickness variations) of the packaging substrate 104.

FIG. 2 depicts a transfer molding system that tolerates non-planarity of the exposed active area integrated circuit die when mounted on the lead frame or packaging substrate according to one embodiment of the present invention. Mold system 200 for packaging exposed active area integrated circuits includes lower and upper mold portions 201 and 202, respectively, receiving an integrated circuit die 203 mounted on a packaging substrate 204. Upper mold portion 202 defines a cavity 205 around integrated circuit die 203 and a portion of packaging substrate 204. Wire bonds (not shown) may optionally connect the integrated circuit die 203 to conductive traces on the packaging substrate 204.

As with the example of FIG. 1, encapsulating material is injected into the cavity 205 to adhere to and harden around portions of the integrated circuit die 203, any wire bonds, and the packaging substrate 204 without or exposed to the cavity 205. However, a portion of the upper mold portion 202 in mold system 200 contacts the active area 206 of the integrated circuit die 203 to prevent injected encapsulating material from contacting that surface 206. The active area 206 is thus left exposed after packaging.

In the present invention, lower mold portion 201 comprises hardened steel 207 covered by a relatively soft, deformable 208. Therefore non-planarity of the adhesive between the integrated circuit die 203 and the packaging substrate 204, and consequent "tilt" of the integrated circuit die 203 with respect to the packaging substrate 204 and the surface of upper mold portion 202 that contacts the active area 206, is compensated by deformation of the relatively soft material 208 (and possibly minor, localized deformation of packaging substrate 204). No gap between the active area 206 and upper mold surface contacting the active area remains into which injected encapsulating material may flow.

FIG. 3 depicts a lower mold portion for a transfer molding system 300 according to an alternative embodiment of the present invention. To promote adaptation of thickness variation or deformation required in order to accommodate non-planar adhesive layers, the lower mold portion 301 may optionally comprise a steel base 307 covered with a deformable material 308 having a variable upper surface.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A method of packaging integrated circuits comprising:
    clamping an upper mold portion and a lower mold portion around an integrated circuit die mounted on an upper surface of a packaging substrate, the upper and lower mold portions contacting upper and lower surfaces of the packaging substrate, respectively, during clamping; and
    bringing a surface on a projection within the upper mold portion into contact with an active area of the integrated circuit die during mold clamping, wherein the contacted active area remains exposed after encapsulation,
    wherein a deformable material is disposed on a surface of the lower mold portion, the deformable material having a soft deformable upper surface that contacts the bottom surface of the packaging substrate during mold clamping, the deformable material deforming during mold clamping as necessary to compensate for misalignment between the projection surface and the active area of the integrated circuit die and to thereby prevent injected encapsulating material from flowing between the projection surface and the contact area.

2. The method according to claim 1, wherein the deformable material deforms during mold clamping by an amount sufficient to accommodate thickness variations in the packaging substrate.

3. The method according to claim 1, wherein the deformable material deforms during mold clamping by an amount sufficient to accommodate non-planarity of an adhesive between the integrated circuit die and the packaging substrate.

4. The method according to claim 1, further comprising:
    receiving the integrated circuit die within a cavity in the upper mold portion during clamping, wherein the upper mold portion contacts the upper surface of the packaging substrate around a periphery of the cavity during mold clamping.

5. The method according to claim 1, wherein the deformable material deforms during mold clamping by an amount sufficient to accommodate thickness variations in the packaging substrate, non-planarity of an adhesive between the integrated circuit die and the packaging substrate, or both.

6. A method of packaging integrated circuits comprising:
    clamping an upper mold portion and a lower mold portion around an integrated circuit die mounted on an upper surface of a packaging substrate, the upper and lower mold portions contacting upper and lower surfaces of the packaging substrate, respectively, and a surface on a projection within the upper mold portion contacting an active area of the integrated circuit die during clamping, wherein the contacted active area remains exposed after encapsulation,
    wherein a deformable material on a surface of the lower mold portion contacts the bottom surface of the packaging substrate during mold clamping, the deformable material having a deformable upper surface contacting the bottom of the packaging substrate, the deformable upper surface of the deformable material deforming during mold clamping as necessary to compensate for misalignment between the projection surface and the active area of the integrated circuit die and to thereby prevent injected encapsulating material from flowing between the projection surface and the contact area.

7. The method according to claim 6, wherein the deformable material deforms during mold clamping by an amount sufficient to accommodate thickness variations in the packaging substrate.

8. The method according to claim 6, wherein the deformable material deforms during mold clamping by an amount sufficient to accommodate non-planarity of an adhesive between the integrated circuit die and the packaging substrate.

9. The method according to claim 6, further comprising:
receiving the integrated circuit die within a cavity in the upper mold portion during clamping, wherein the upper mold portion contacts the upper surface of the packaging substrate around a periphery of the cavity during mold clamping.

10. The method according to claim 9, wherein the deformable material deforms during mold clamping by an amount sufficient to accommodate thickness variations in the packaging substrate, non-planarity of an adhesive between the integrated circuit die and the packaging substrate, or both.

11. A method comprising:
receiving a substrate between a first mold portion, and a second mold portion,
the first mold portion having a surface on a projection thereon contacting an active area of the substrate during clamping, wherein the contacted active area remains exposed after encapsulation, the second mold portion having a base and a deformable material on at least a portion of the base, the deformable material having an upper surface including a region that contacts at least a portion of the substrate during mold clamping and that is deformable within the region that contacts the substrate during mold clamping, the deformable portion of the upper surface of the deformable material deforming during mold clamping to compensate for misalignment between the projection surface and the active area of the substrate and to thereby prevent injected encapsulating material from flowing between the projection surface and the active area.

12. The method of claim 11, wherein the deformable material compensates for at least one of a variable thickness of the substrate and a non-planarity of an adhesive between an integrated circuit die and the substrate.

13. The method of claim 12, wherein the first mold portion includes a cavity capable of receiving an integrated circuit die mounted on the substrate, the first mold portion contacting a surface of the substrate around a periphery of the cavity during mold clamping.

14. The method according to claim 1, wherein the deformable material is an elastomeric material.

15. The method according to claim 14, wherein the elastomeric material is a neoprene rubber.

16. The method according to claim 1, further comprising injecting encapsulating material into at least a portion of a cavity in the upper mold.

17. The method according to claim 6, wherein the deformable material a neoprene rubber.

18. The method according to claim 6, further comprising injecting encapsulating material into at least a portion of a cavity in the upper mold.

19. The method according to claim 11, wherein the deformable material a neoprene rubber.

20. The method according to claim 11, further comprising injecting encapsulating material into at least a portion of a cavity in the upper mold.

\* \* \* \* \*